(12) United States Patent
Zhang

(10) Patent No.: US 9,806,022 B2
(45) Date of Patent: Oct. 31, 2017

(54) METHOD FOR MAKING SEMICONDUCTOR DEVICE WITH STACKED ANALOG COMPONENTS IN BACK END OF LINE (BEOL) REGIONS

(71) Applicant: STMICROELECTRONICS, INC., Coppell, TX (US)

(72) Inventor: John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/499,665

(22) Filed: Apr. 27, 2017

(65) Prior Publication Data

US 2017/0229391 A1    Aug. 10, 2017

Related U.S. Application Data

(63) Continuation of application No. 15/082,987, filed on Mar. 28, 2016, now Pat. No. 9,660,015, which is a continuation of application No. 14/574,855, filed on Dec. 18, 2014, now Pat. No. 9,305,997.

(51) Int. Cl.
| | |
|---|---|
| *H01L 23/528* | (2006.01) |
| *H01L 23/522* | (2006.01) |
| *H01L 23/532* | (2006.01) |
| *H01L 21/768* | (2006.01) |

(52) U.S. Cl.
CPC ...... *H01L 23/528* (2013.01); *H01L 21/76805* (2013.01); *H01L 21/76816* (2013.01); *H01L 21/76831* (2013.01); *H01L 21/76883* (2013.01); *H01L 23/5223* (2013.01); *H01L 23/5226* (2013.01); *H01L 23/5228* (2013.01); *H01L 23/53223* (2013.01); *H01L 23/53238* (2013.01); *H01L 23/53266* (2013.01)

(58) Field of Classification Search
CPC .................. H01L 23/528; H01L 21/76805
See application file for complete search history.

(56) References Cited

U.S. PATENT DOCUMENTS

| | | |
|---|---|---|
| 6,433,379 B1 | 8/2002 | Lopatin et al. |
| 7,189,615 B2 | 3/2007 | Rao et al. |
| 7,902,629 B2 | 3/2011 | Chinthakindi et al. |
| 8,093,637 B2 | 1/2012 | Engelhardt et al. |
| 8,546,914 B2 | 10/2013 | Su et al. |
| 2002/0163029 A1 | 11/2002 | Dirnecker et al. |
| 2005/0082592 A1 | 4/2005 | Chang et al. |
| 2005/0275005 A1 | 12/2005 | Choi et al. |
| 2007/0152258 A1 | 7/2007 | Kim |

*Primary Examiner* — Errol Fernandes
(74) *Attorney, Agent, or Firm* — Seed IP Law Group LLP

(57) ABSTRACT

A method for making a semiconductor device may include forming a first dielectric layer above a semiconductor substrate, forming a first trench in the first dielectric layer, filling the first trench with electrically conductive material, removing upper portions of the electrically conductive material to define a lower conductive member with a recess thereabove, forming a filler dielectric material in the recess to define a second trench. The method may further include filling the second trench with electrically conductive material to define an upper conductive member, forming a second dielectric layer over the first dielectric layer and upper conductive member, forming a first via through the second dielectric layer and underlying filler dielectric material to the lower conductive member, and forming a second via through the second dielectric layer to the upper conductive member.

18 Claims, 8 Drawing Sheets

METHOD FOR MAKING SEMICONDUCTOR DEVICE WITH STACKED ANALOG COMPONENTS IN BACK END OF LINE (BEOL) REGIONS

BACKGROUND

Technical Field

The present invention relates to the field of electronic devices and, more particularly, to semiconductor devices and related methods.

Description of the Related Art

Semiconductor device manufacturing generally involves two phases, the first being the Front-End-of-Line (FEOL) processing in which the digital circuitry (e.g., transistors, etc.) are formed on a semiconductor substrate. The second phase is the Back-End-Of-Line (BEOL) processing, in which the analog components and conductive or metal traces are formed to connect various active semiconductor components together and to corresponding input/output connectors of the device package.

As technology nodes continues to scale down, the density of the digital circuitry continues to increase. However, the rate of increase in the analog circuitry density is generally less than that of the digital circuits. Resistors and capacitors are sometimes formed during BEOL processing for use as frequency filters, etc. Yet, the ability to produce an appropriate number of such analog resistors, capacitors, and inductors in the space available for BEOL processing for the ever-increasing density of digital components in a semiconductor device may be difficult. As such, further advances in BEOL processing may be desirable in some applications.

BRIEF SUMMARY

A method for making a semiconductor device may include forming a first dielectric layer above a semiconductor substrate, forming a first trench in the first dielectric layer, filling the first trench with electrically conductive material, removing upper portions of the electrically conductive material to define a lower conductive member with a recess thereabove, forming a filler dielectric material in the recess to define a second trench. The method may further include filling the second trench with electrically conductive material to define an upper conductive member, forming a second dielectric layer over the first dielectric layer and upper conductive member, forming a first via through the second dielectric layer and underlying filler dielectric material to the lower conductive member, and forming a second via through the second dielectric layer to the upper conductive member.

In accordance with one example implementation, forming the first conductive via may include forming a first pair of conductive vias coupled to opposing lateral ends of the lower conductive member to define a first resistor therewith, and forming the second conductive via may include forming a second pair of conductive vias coupled to opposing lateral ends of the upper conductive member to define a second resistor therewith. In an example embodiment, the first and second resistors may include different electrically conductive materials.

In accordance with another example implementation, forming the first via may include forming a single via to the lower conductive member to define a lower capacitive plate therewith, and forming the second via may include forming a single via to the upper conductive member to define an upper capacitive plate therewith. The upper and lower capacitive plates may define a capacitor with the dielectric filler therebetween.

The method may further include forming at least one integrated circuit on the substrate. Furthermore, the first and second dielectric layers may comprise first and second inter-level dielectric (ILD) layers. By way of example, the electrically conductive material may include at least one of tungsten, copper, and aluminum. The method may also include forming a first nitride liner in the first trench prior to filling the first trench with electrically conductive material, and forming a second nitride liner in the second trench prior to filling the second trench with electrically conductive material. The filler dielectric material may comprise a high density plasma (HDP) oxide, for example.

A related semiconductor device may include a first dielectric layer above a semiconductor substrate and having a first trench therein, a lower conductive member in the first dielectric layer, a filler dielectric material over the lower conductive member having a second trench therein and within the first dielectric layer, and an upper conductive member in the second trench in the filler dielectric material and within the first dielectric layer. The semiconductor device may further include a second dielectric layer over the first dielectric layer and upper conductive member, a first via extending through the second dielectric layer and underlying filler dielectric material to the lower conductive member, and a second via extending through the second dielectric layer to the upper conductive member.

BRIEF DESCRIPTION OF THE SEVERAL VIEWS OF THE DRAWINGS

FIG. 1b is a cross-sectional view of ILD layer and master layer metal area of

FIG. 1a taken along line b-b.

DETAILED DESCRIPTION

Figure 1A:
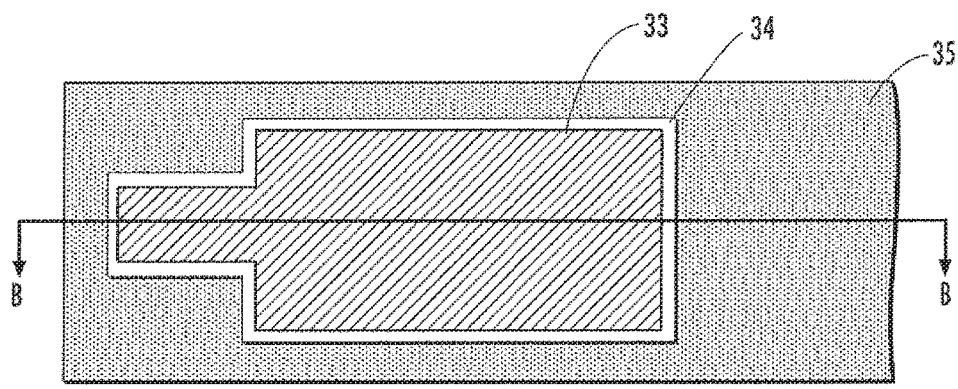
FIG. 1a is a top view of an inter-level device (ILD) layer with a master layer metal area therein used for making a semiconductor device in accordance with the present invention.
Figure 1B:
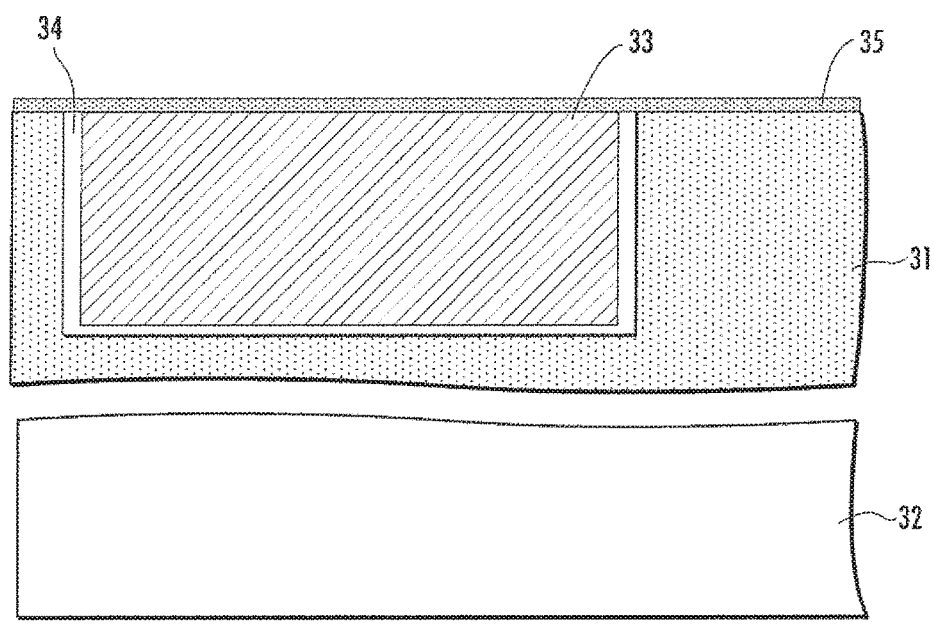

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similarly elements in different embodiments.

Referring initially to FIGS. 1*a*-7*b*, a method for making a semiconductor device 30 which provides enhanced analog circuit density in Back-End-Of-Line (BEOL) regions is first described. The method may include forming a first dielectric layer 31, such as an ultra low K (ULK) inter-level dielectric (ILD) layer, above a semiconductor substrate 32. By way of example, the substrate 32 may be a silicon substrate, although other suitable semiconductor substrate materials may also be used. As will be understood by those skilled in the art, during the Front-End-of-Line (FEOL) processing active circuit regions (e.g., "digital" circuitry) are formed in the substrate 32. The first dielectric layer 31 may be formed directly on the substrate 32 in some embodiments, or there may be one or more intervening levels (e.g., metal interconnect layers, etc.) between the first dielectric layer and the substrate, as will also be understood by those skilled in the art.

A first trench is formed in the first dielectric layer 31, and then filled with an electrically conductive material 33, such as a metal or metal alloy. By way of example, the metal or alloy may include one of more of tungsten, copper, and aluminum, although other suitable conductive materials may be used in different embodiments. Furthermore, prior to filling the first trench with the electrically conductive material 33, a liner 34 (e.g., TiN, etc.) may be formed in the trench. This accordingly forms a master layer metal area that will be processed to produce a multi-level metal component stack that may be used for the formation of resistors, capacitors, and/or inductors, as will be discussed further below. A dielectric insulator layer 35, such as a high density plasma (HDP) oxide layer, is formed over upper portions of the electrically conductive material 33 and adjacent upper portions of the first dielectric layer 31.

Figure 2A:
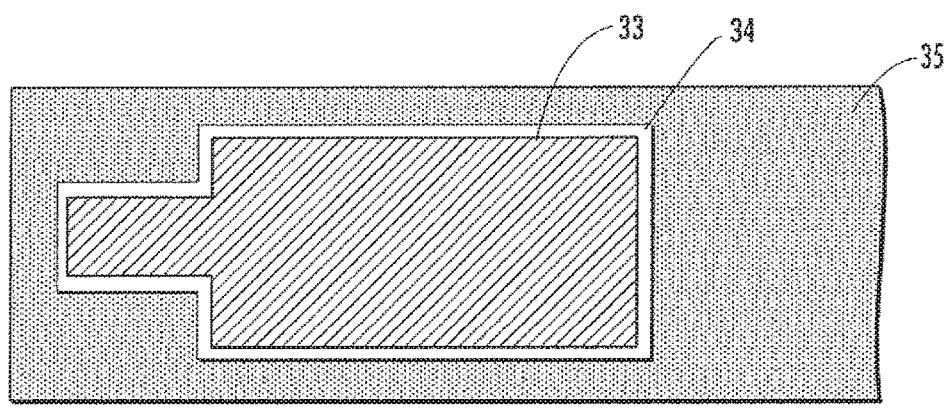
FIGS. 2a and 2b are top and cross-sectional views respectively corresponding to FIGS. 1a and 1b, after recess of the master layer metal area to form a lower conductive member.
Figure 2B:
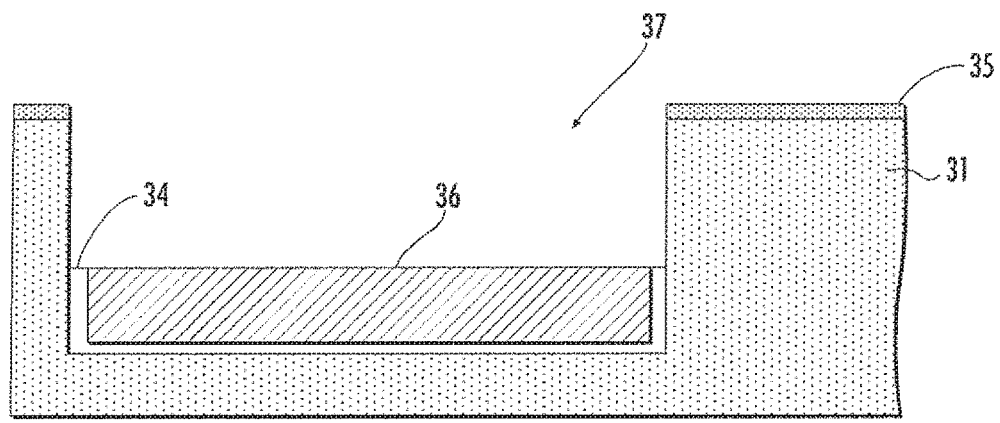

As seen in FIGS. 2*a* and 2*b*, the method further illustratively includes removing or recessing upper portions of the electrically conductive material 33 (and liner 34) to define a lower conductive member 36 with a recess 37 thereabove, which may be done using conventional metal etching techniques, for example. Furthermore, the recess 37 may have a filler dielectric material 38 formed therein, which again may be an HDP oxide, for example, although other suitable dielectric materials may also be used in different embodiments. In other words, the filler dielectric material may be deposited as a conformal layer, although other approaches may also be used. To this end, the filler dielectric material 38 may serve as the dielectric or insulator of a capacitor(s) later formed in the master metal layer area, and thus different dielectric materials may be selected depending upon the desired capacitive properties for the given implementation, as will be understood by those skilled in the art.

Figure 3A:
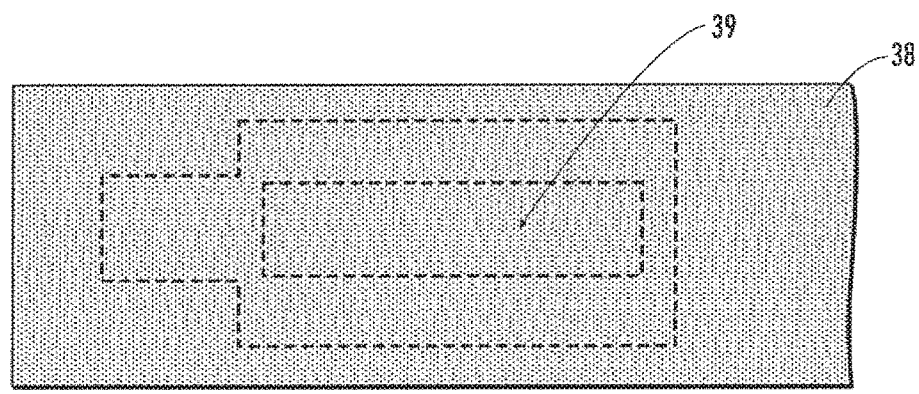
FIGS. 3a and 3b are top and cross-sectional views respectively corresponding to FIGS. 2a and 2b, after deposition of a conformal dielectric layer.
Figure 3B:
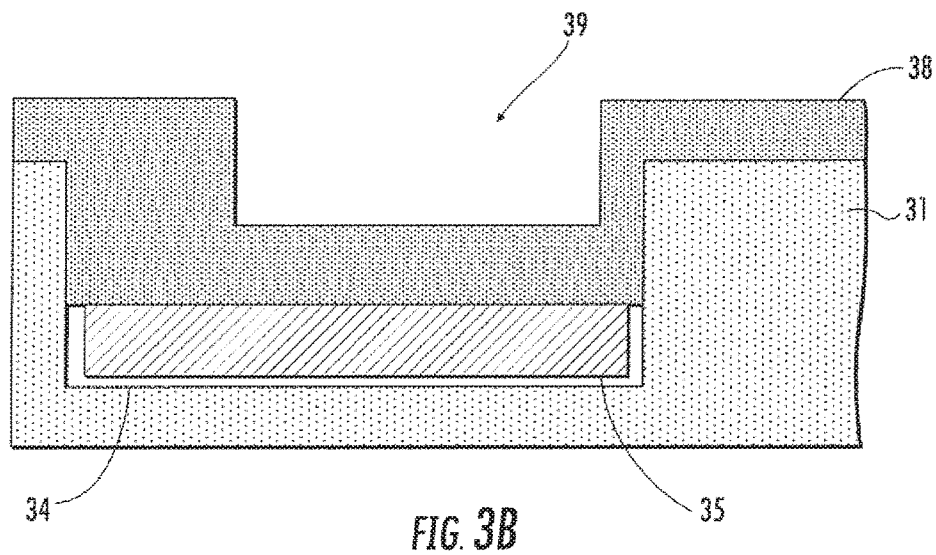
Figure 4A:
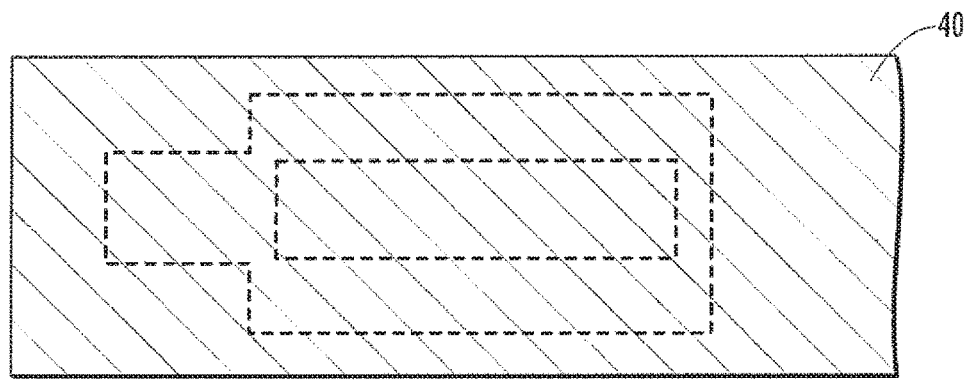
FIGS. 4a and 4b are top and cross-sectional views respectively corresponding to FIGS. 3a and 3b, after deposition of a metal liner and metal layer over the conformal dielectric layer.
Figure 4B:
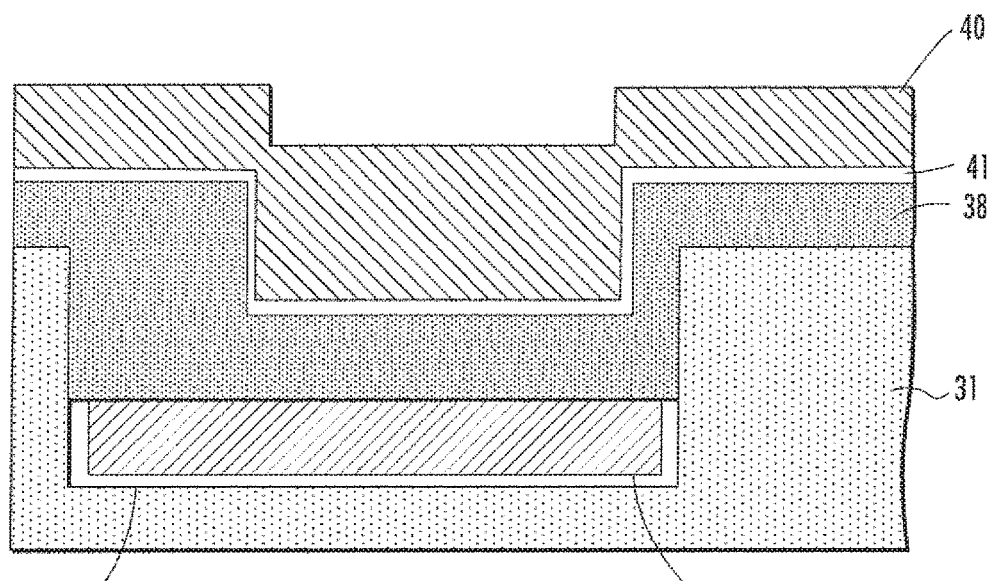
Figure 5A:
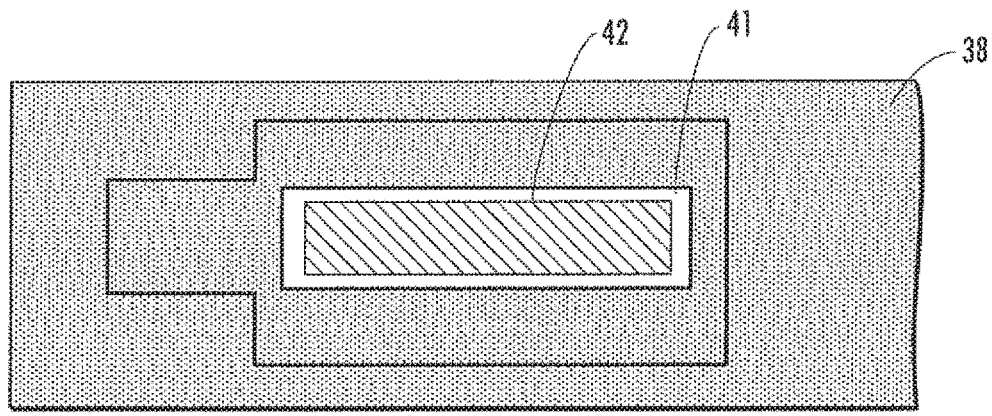
FIGS. 5a and 5b are top and cross-sectional views respectively corresponding to FIGS. 4a and 4b, after patterning of the metal layer over the conformal dielectric layer to form an upper conductive member.
Figure 5B:
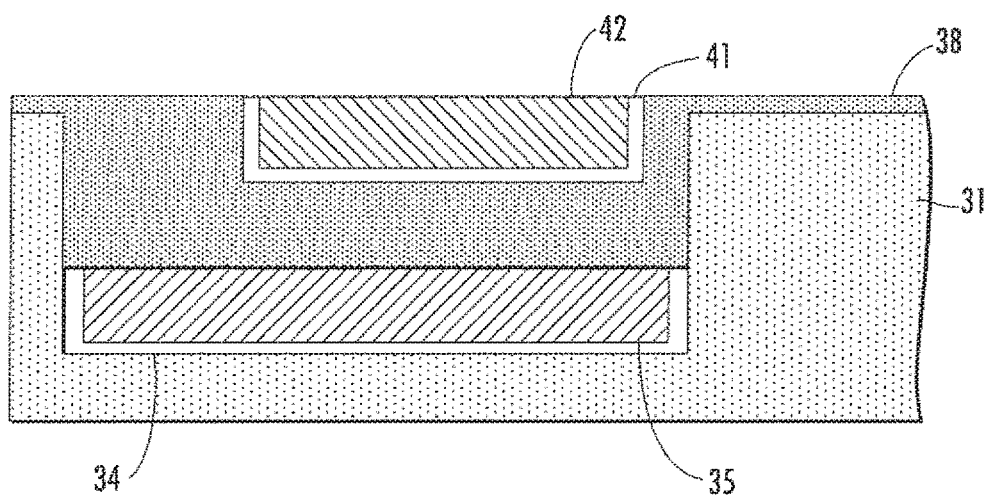

The filler dielectric material 38 has a second trench 39 therein, as seen in FIG. 3*b*. The second trench 39 may then be filled with a liner 41 (e.g., TiN, etc.) and an electrically conductive material 40, which may similarly include a metal or alloy such as those described above. Another patterning (e.g., CMP) or etching step may be performed to define an upper conductive member 42 from the electrically conductive material 40, as seen in FIGS. 5*a* and 5*b*. The lower conductive member 35 and upper conductive member 42 are therefore elongate, planar metal conductive elements formed within the same master level metal layer, with the "footprint" of the upper conductive member being smaller than, and laterally inside of, the footprint of the lower conductive member. Stated alternatively, the lower conductive member 35 is wider than the upper conductive member 42, and the upper conductive member vertically overlaps portions of the lower conductive member.

Figure 6A:
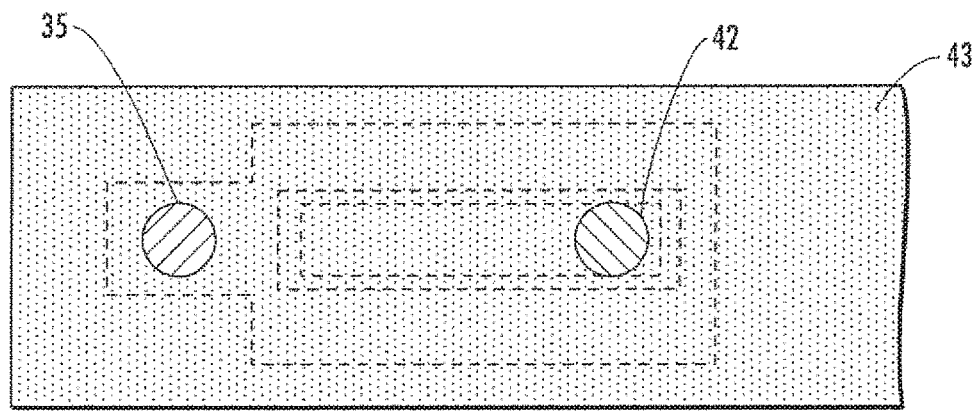
FIGS. 6a and 6b are top and cross-sectional views respectively corresponding to FIGS. 5a and 5b, after deposition of an upper dielectric layer and via trench formation to the upper and lower conductive members.
Figure 6B:
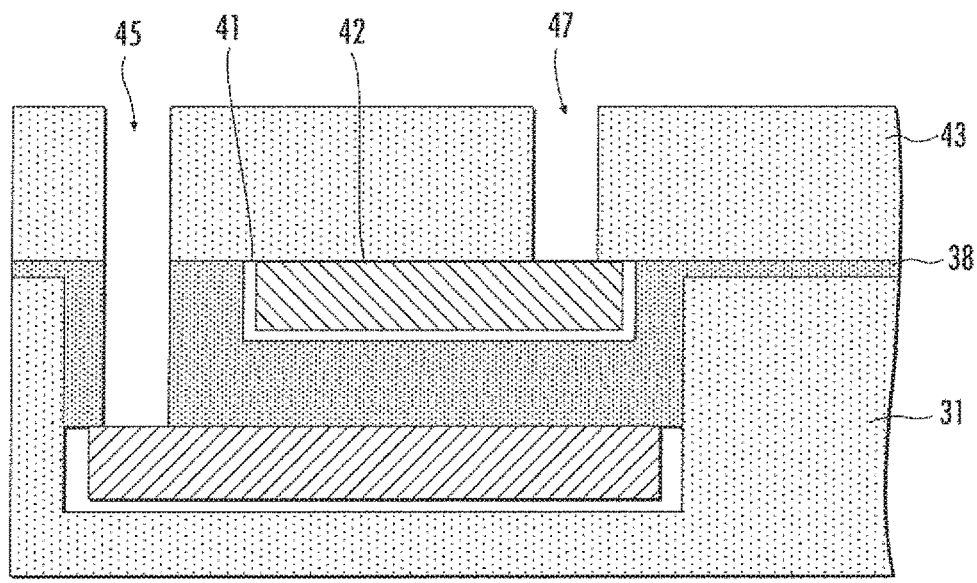
Figure 7A:
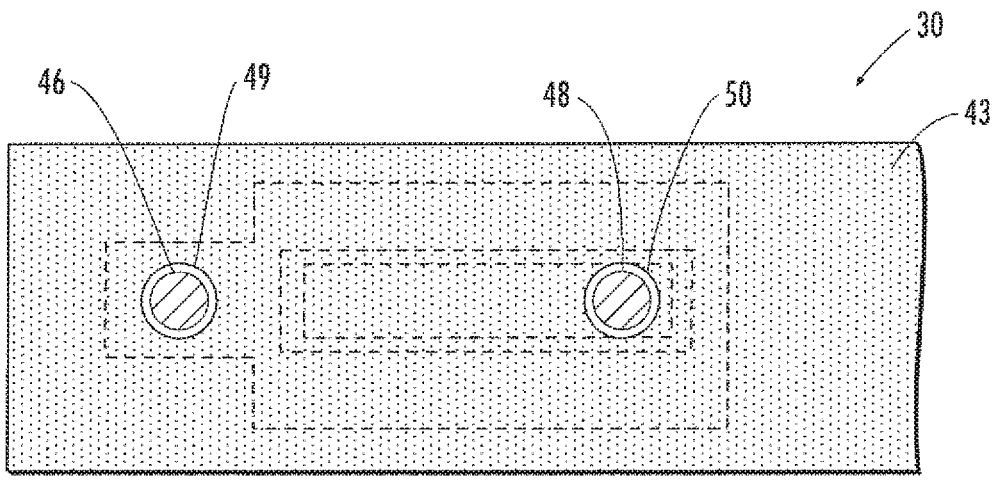
FIGS. 7a and 7b are top and cross-sectional views respectively corresponding to FIGS. 6a and 6b, after lining and filling the vias so that the upper and lower conductive members define upper and lower plates of a capacitor.
Figure 7B:
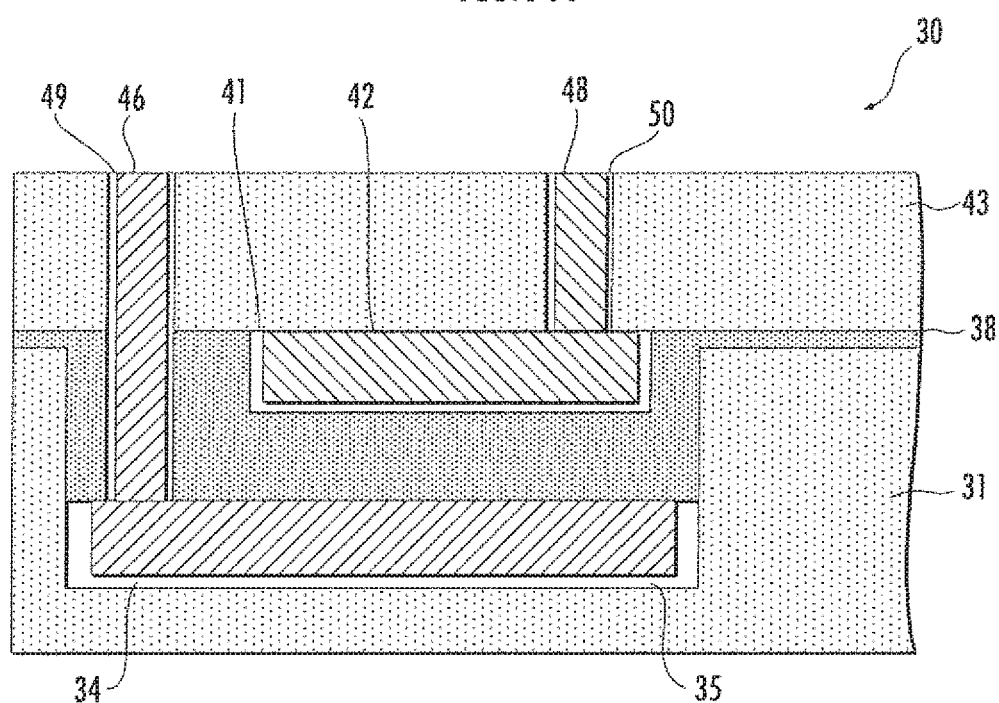

A second dielectric layer 43 is formed over the upper conductive member 42 and dielectric material 38, a first opening 45 for a first via 46 may be formed through the second dielectric layer and underlying filler dielectric material to the lower conductive member 34, and a second opening 47 for a second via 48 may be formed through the second dielectric layer to the upper conductive member 42, as seen in FIGS. 6*a*, 6*b*. The first and second vias 46, 48 may include a metal, such as those discussed above, and respective liners 49, 50 may be formed in the first and second recesses 45, 47 prior to formation of the metal vias 46, 48 (see FIGS. 7*a*, 7*b*)

In the illustrated example, a single first via 46 extends to the lower conductive member 35 to define a lower capacitive plate, and a single second via 48 extends to the upper conductive member 42 to define an upper capacitive plate therewith. As such, the lower and upper capacitive plates 35, 42 define a capacitor with the dielectric filler 38 therebetween.

Figure 8:
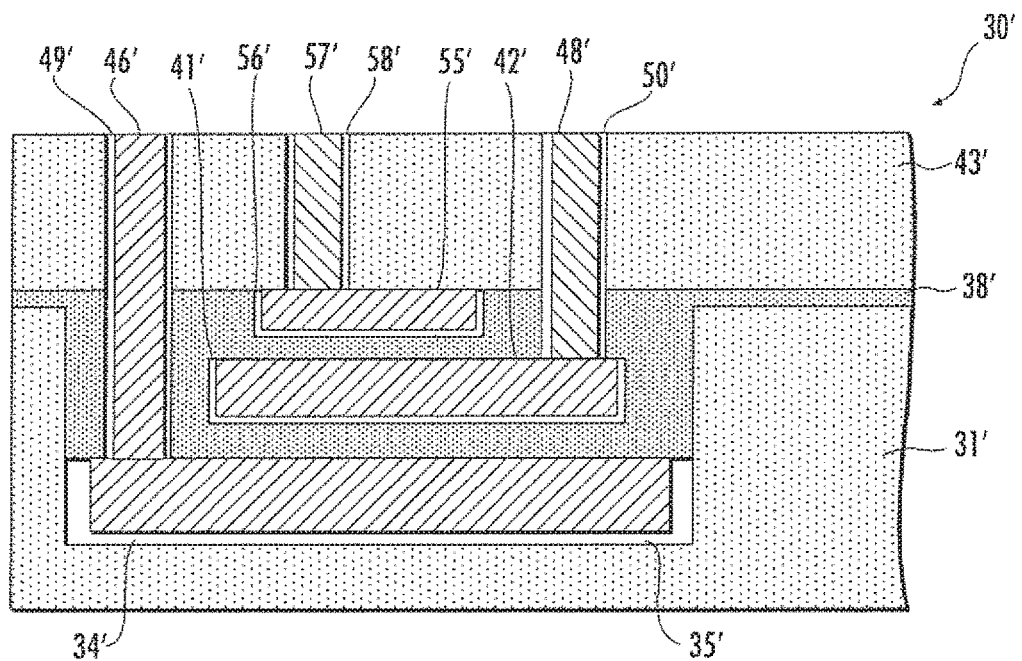
FIG. 8 is a cross-sectional view similar to that of FIG. 7b, but for another example embodiment including a double vertical capacitor arrangement.

In accordance with another example embodiment shown in FIG. 8, a double or two-level capacitive stack arrangement may also be formed. Here, a first capacitor is formed between the conductive members 35' and 42' and the intervening dielectric filter 38', as before. Yet, here the conductive member 42' is an intermediate conductive member vertically positioned between the lower conductive member 35', and another (upper) conductive member 55' (which may have its own liner 56', as with the other conductive members). As such, the intermediate conductive member 42' and the upper conductive member 55' define a second capacitor in a vertically stacked with the first capacitor. As before, a single via 57' (which also has a liner 58') extends through the second dielectric layer 43' to the upper conductive member 55', as shown.

Figure 9:
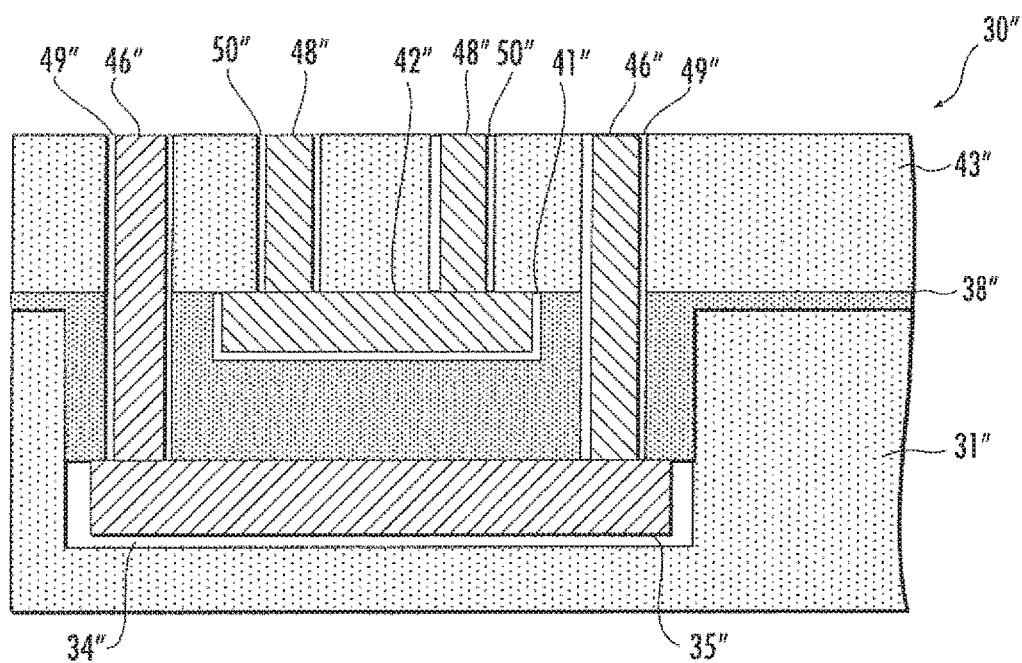
FIGS. 9 is a cross-sectional view similar to that of FIG. 7*b*, but for another example embodiment including a double vertical resistor arrangement.

In accordance with still another example implementation now described with respect to FIG. 9, rather than a using single vias as described above, a first pair of conductive vias 46" may be formed which are coupled to opposing lateral ends of the lower conductive member 35" to define a first resistor therewith, and a second pair of conductive vias 48" are coupled to opposing lateral ends of the upper conductive member 42" to define a second resistor therewith above the first resistor. In some embodiments, the conductive members 35", 42" members may include different materials to provide different resistance values, for example, although the same material may also be used for both. In other configurations, conductive members may be interconnected to form an inductor(s), as will be appreciated by those skilled in the art.

The above-described techniques therefore provide an approach to make relatively high density RLC integrated circuits within a given master metal layer. Moreover, this may advantageously be done with the double or multi-stack conductive members being formed in a single master lithography step, as will be appreciated by those skilled in the art. As a result, this may help reduce chip "real estate" or surface area usage by putting the analog circuitry (e.g., resistors, capacitors, inductors) in the BEOL metal layers rather than on the periphery of the chip. The above-noted approach may also relax the requirements of the lithography tool capability significantly, and also potentially save BEOL manufacturing costs. It should also be noted that the above-described process may be implemented for a number of different circuit chips, including digital devices (processors, microcontrollers, memory, etc.), analog devices, mixed signal devices (such as, for example, consumer, tablet, phone, computer, servers, gaming, set top box, TV, and automotive devices), Micro-Electro-Mechanical Systems (MEMS) devices, sensors, etc.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A device, comprising:
   a first dielectric layer having a top surface;
   a trench in the first dielectric layer, the trench having a first depth;
   a first conductive layer in the trench, a top surface of the first conductive layer being at a second depth in the first trench that is less than the first depth;
   a second dielectric layer in the trench on the first conductive layer; and
   a second conductive layer in the second dielectric layer, a top surface of the second conductive layer being above the top surface of the first dielectric layer.

2. The device of claim 1, further comprising a first contact coupled to the first conductive layer, the first contact extending through the second dielectric layer in the trench.

3. The device of claim 2, further comprising a second contact coupled to the second conductive layer.

4. The device of claim 3, further comprising a third dielectric layer on the second conductive layer, the first and second contacts extending through the third dielectric layer.

5. The device of claim 1 wherein the second dielectric layer includes a first portion in the trench and a second portion that extends on the top surface of the first dielectric layer.

6. The device of claim 5, further comprising a third dielectric layer on the second dielectric layer.

7. The device of claim 6, further comprising a first contact extending through the second and third dielectric layer to the first conductive layer and a second contact extending through the third dielectric layer to the second conductive layer.

8. A device, comprising:
   a first dielectric layer having a top surface;
   a trench in the first dielectric layer;
   a first conductive layer in the trench, a top surface of the first conductive layer being below the top surface of the first dielectric layer;
   a second dielectric layer in the trench on the first conductive layer; and
   a second conductive layer in the second dielectric layer, a top surface of the second conductive layer being above the top surface of the first dielectric layer and a bottom surface of the second conductive layer being below the top surface of the first dielectric layer.

9. The device of claim 8, further comprising a first contact coupled to the first conductive layer, the first contact extending through the second dielectric layer in the trench.

10. The device of claim 9, further comprising a second contact coupled to the second conductive layer.

11. The device of claim 10, further comprising a third dielectric layer on the second conductive layer, the first and second contacts extending through the third dielectric layer.

12. The device of claim 8 wherein the second dielectric layer includes a first portion in the trench and a second portion that extends on the top surface of the first dielectric layer.

13. The device of claim 12, further comprising a third dielectric layer on the second dielectric layer.

14. The device of claim 13, further comprising a first contact extending through the second and third dielectric layer to the first conductive layer and a second contact extending through the third dielectric layer to the second conductive layer.

15. A device, comprising:
   a substrate;
   a first dielectric layer on the substrate;
   a first trench in the first dielectric layer;
   a first liner in the first trench;
   a first conductive layer in the first trench on the first liner;
   a second dielectric layer in the first trench;
   a second trench in the second dielectric layer;
   a second liner in the second trench; and
   a second conductive layer in the second trench on the second liner.

16. The device of claim 15, further comprising a third dielectric layer on the second dielectric layer and on the second conductive layer.

17. The device of claim 16, further comprising a first contact coupled to the first conductive layer and a second contact coupled to the second conductive layer.

18. The device of claim 17 wherein the first contact extends through the second and third dielectric layer and the second contact extends through the third dielectric layer.

* * * * *